United States Patent [19]

Coudoux

[11] Patent Number: 4,869,340

[45] Date of Patent: Sep. 26, 1989

[54] VERY HIGH PERFORMANCE LOUDSPEAKER ENCLOSURES

[76] Inventor: Christian A. Coudoux, Le Belvédère, 04130 Ganagobie, France

[21] Appl. No.: 208,993

[22] Filed: Jun. 17, 1988

[30] Foreign Application Priority Data

Jun. 22, 1987 [FR] France ................................ 87 08845

[51] Int. Cl.⁴ ................................................ H05K 5/00

[52] U.S. Cl. .................................... 181/146; 181/147; 181/151; 181/199

[58] Field of Search ............... 181/146, 148, 151, 155, 181/156, 160, 199, 147; 381/158, 160

[56] References Cited

U.S. PATENT DOCUMENTS

| | | | |
|---|---|---|---|
| 1,912,454 | 6/1933 | Hutter | 181/146 |
| 2,986,228 | 5/1961 | Rettinger et al. | 181/199 |
| 4,591,020 | 5/1986 | Hruby, Jr. | 181/199 X |
| 4,690,244 | 9/1987 | Dickie | 181/146 |

FOREIGN PATENT DOCUMENTS

| | | |
|---|---|---|
| 2930069 | 2/1981 | Fed. Rep. of Germany . |
| 2363956 | 3/1978 | France . |

OTHER PUBLICATIONS

Japanese Abstracts 60-186191 for a Speaker Device.
Japanese Abstracts 56-165487 for a Cabinet for Acoustic Machinery.
Japanese Abstracts 57-155893 for a Speaker System.
Japanese Abstracts 61-150494 for a Cabinet for a Speaker.
Japanese Abstracts 57-116494 for a Box for a Speaker.

*Primary Examiner*—B. R. Fuller
*Attorney, Agent, or Firm*—Ladas & Parry

[57] ABSTRACT

Going inwardly from the outside, the walls of the housing comprise a multi-ply slab, one or more layers of elastomer coating, a plate of amorphous bitumen, and acoustic screens constituted by substantially contiguous parallel tubes which are filled with a solid material which is in the divided state and highly compacted, e.g. sand, or particles of graphite, or grains of silica. In addition, the enclosures include one or more blocks behind the loudspeakers and made of cellular foam with channels passing therethrough parallel to the axes of the loudspeakers.

12 Claims, 3 Drawing Sheets

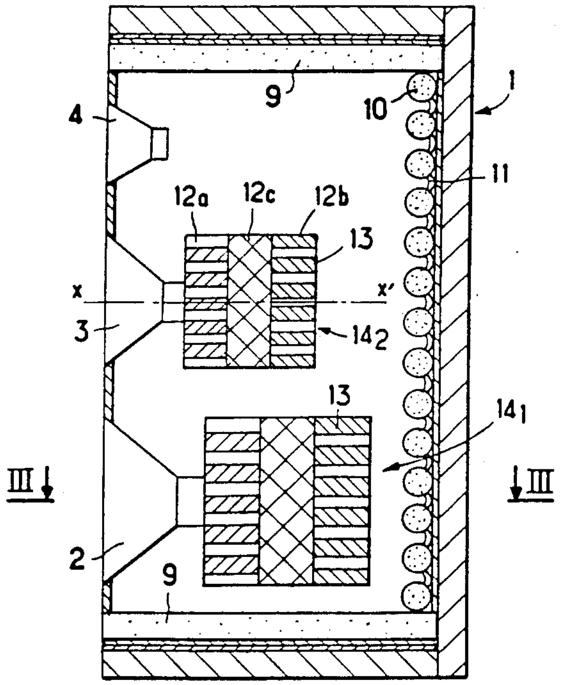
Fig. 2
Fig. 3
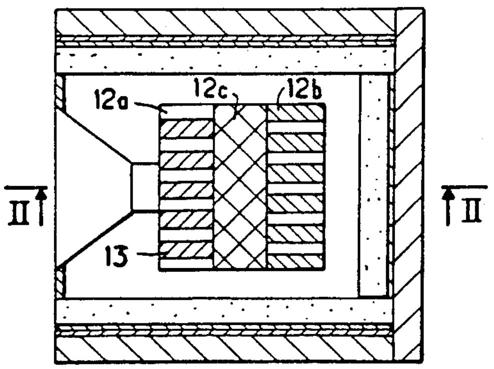
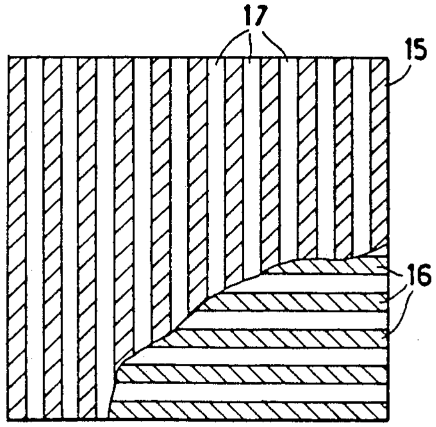
Fig. 4

VERY HIGH PERFORMANCE LOUDSPEAKER ENCLOSURES

The present invention relates to very high performance loudspeaker enclosures.

The field of the invention is the construction of loudspeaker enclosures.

BACKGROUND OF THE INVENTION

Conventional loudspeaker enclosures containing one or more loudspeakers are subjected to parasitic vibration due to the pressure oscillations generated by the loudspeakers, in particular the loudspeakers for generating base and midfrequency sound. These pressure oscillations act on the walls of the enclosure and cause them to vibrate. In addition, they are multiply reflected on the walls and this gives rise to distortion and coloration in the sound, thereby degrading the quality of music or sound reproduction.

Various solutions have been proposed for increasing sound absorption and reducing sound reflection at the walls of the enclosure.

One of these solutions consists in constructing double-walled enclosures and in filling the space between the two walls with a dense powder material, which is generally sand.

This solution has had to be abandonned since it is expensive due to the fact that two enclosures must be made and the sand must be as highly compressed as possible in the space between them. Further, under the effect of vibration, sand tends to compact, thereby creating voids which may form resonating cavities. Finally, the sand used is often damp, and dampness may give rise to mold which attacks the walls of the enclosure.

Other solutions consist in lining the inside faces of the enclosure walls with fibrous padding made of glass or rock wool, or felt, or "hush" cloth; however sound absorption due to such padding is relatively low, particularly for base sound.

Another problem encountered in loudspeaker enclosures stems from the fact that interference takes place in the inside space behind the loudspeakers between the pressure reflected by the walls and waves due to the displacements of the backs of the loudspeaker cones and the tuning ports.

Some manufacturers have made enclosures which include, behind the loudspeakers, a perforated wall or labyrint constituted by a wooden lattice delimiting cells which are lined with fibrous material.

An object of the present invention is to provide high fidelity loudspeaker enclosures having very good sound reproduction qualities due to novel acoustic screens placed against the inside faces of the walls.

Another object of the invention is to further improve the quality of reproduction by enclosures containing said acoustic screens by means of absorbent blocks which are placed behind the loudspeakers.

Loudspeaker enclosures in accordance with the invention are of the type suitable for containing one or more loudspeakers placed in an enclosure.

SUMMARY OF THE INVENTION

The objects of the invention are achieved by means of enclosures whose walls are lined on the inside with screens constituted by substantially contiguous parallel tubes which are filled with a solid material in the divided state which material is preferably sand, graphite, or silica.

In a preferred embodiment, the screen lining each wall is constituted by parallel tubes which are interconnected by deformable and flexible connecting elements with which they constitute a single part.

Advantageously, the tubes in the screens are disposed horizontally.

In a preferred embodiment, an enclosure in accordance with the invention further includes one or more insulating blocks inside said enclosure, said blocks being made of a cellular material pierced by channels running parallel to the axes of the loudspeakers.

The invention provides novel high fidelity loudspeaker enclosures which provide very good sound reproduction quality. Sound coloration and distortion are greatly reduced by virtue of the fact that enclosure wall vibration is highly attenuated as is interference inside the cavity situated behind the loudspeaker.

BRIEF DESCRIPTION OF THE DRAWINGS

Embodiments of loudspeaker enclosures in accordance with the invention are described below by way of non-limiting example with reference to the accompanying drawings, in which:

FIG. 2 is a vertical section through an enclosure in accordance with the invention;

FIG. 3 is a horizontal section on line III—III of FIG. 2;

FIG. 4 is a partially cut-away horizontal section through another embodiment of an absorbent block in accordance with the invention.

MORE DETAILED DESCRIPTION

Figure 1:
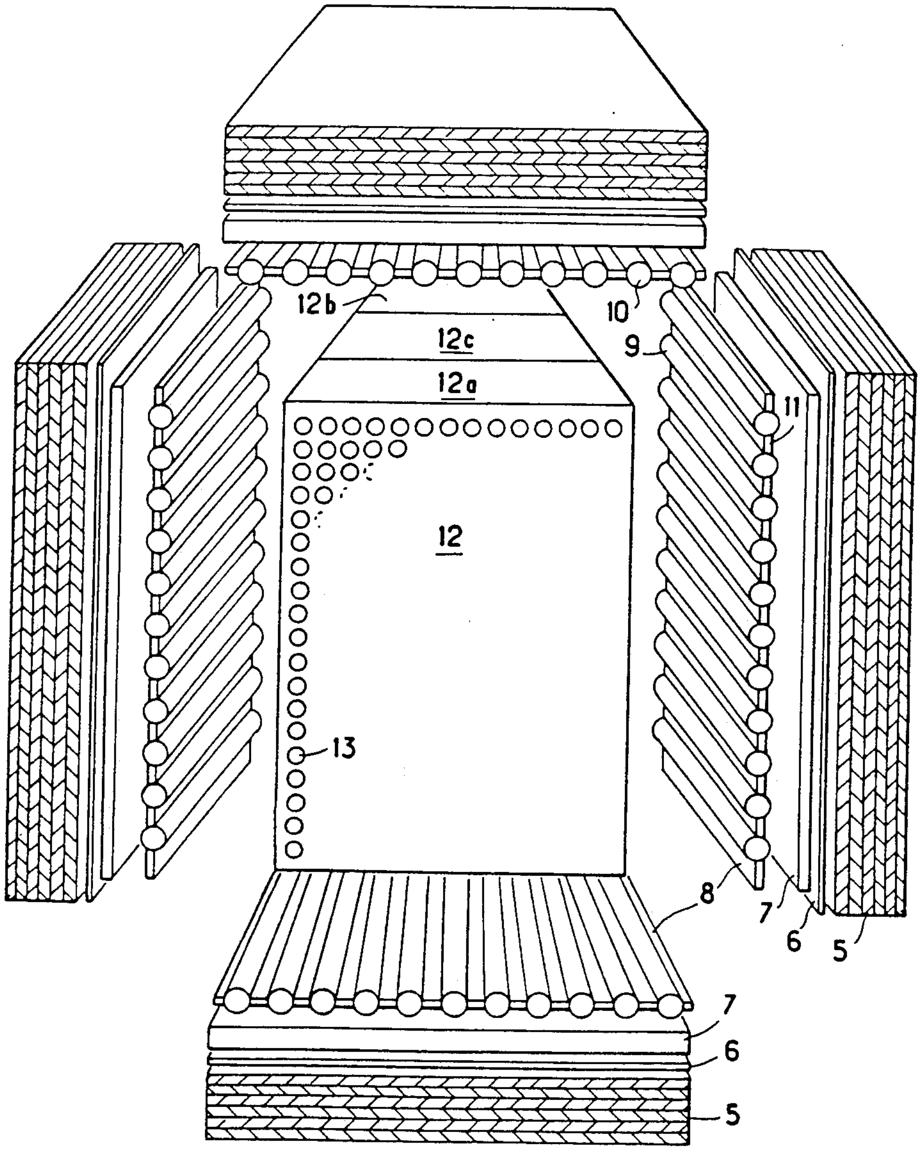
FIG. 1 is an exploded perspective view of the walls of an enclosure in accordance with the invention.
Figure 5:
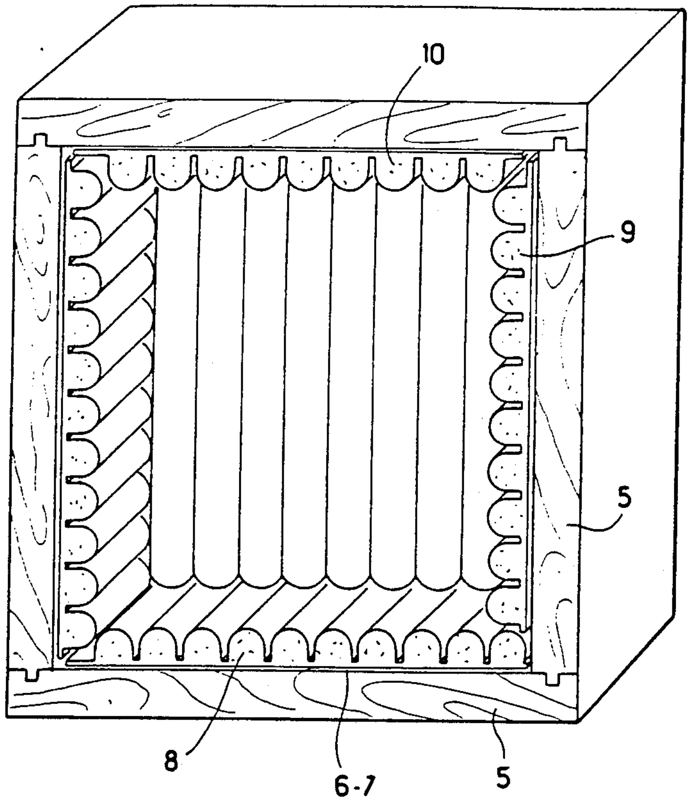
FIG. 5 is a perspective front view of the housing of a loudspeaker enclosure in accordance with the invention.

FIG. 1 is an exploded view of a portion of a loudspeaker enclosure in accordance with the invention.

In order to clarify the drawing, this figure omits both, the rear wall and the front wall together with the loudspeakers.

A loudspeaker enclosure in accordance with the invention comprises a housing 1 which is shown as being generally rectangular in shape, but which could have some other shape.

The housing 1 delimits an internal cavity in which one or more loudspeakers are disposed (as can be seen in FIGS. 2 and 3), e.g. a speaker 2 for base sounds, a speaker 3 for mid-range sounds, and a speaker 4 for treble sounds, with the cones of the speakers being forwardly directed.

The side, top, bottom, and rear walls of the housing comprise, going inwardly from the outside: a slab of wood 5 which may be a multi-ply slab of birchwood or maplewood having a thickness of 12 mm to 25 mm, followed by two layers 6 of elastomer coating which is sprayed underpressure onto the inside faces of the slabs 5, and then a plate 7 of amorphous bitumen having a thickness of about 5 mm.

In accordance with an essential characteristic of the invention, the insides of the enclosure walls are lined with a non-reflecting absorbent screen 8 made up of substantially contiguous parallel tubes which are filled with a dense solid material in the divided state, e.g. sand or particles of graphite or grains of silica.

The material is highly compacted in the tubes while they are being filled so that vibration is unlikely to give rise to further compacting and hence to voids.

FIGS. 1 to 3 show a preferred example in which the tubes 9 lining the side walls, the top, and the bottom are all horizontal and parallel to the axes of the loudspeakers, while the tubes 10 lining the back wall are horizontal and perpendicular to the axes of the loudspeakers.

In a variant, the tubes 9 and 10 could be vertical or inclined.

FIG. 1 shows an embodiment in which the screen lining each plane wall is constituted by a single part comprising parallel tubes 9 and 10 which are interconnected by a flexible deformable film 11.

The screens are shown in a deployed position in FIG. 1. Once they are in place, as shown in FIG. 2, the tubes are juxtaposed and meet one another or nearly meet one another with the flexible connections 11 being folded.

The flexible connections 11 may be constituted by a continuous film or by tapes interconnecting the tubes.

In a preferred embodiment, the tubes 9 and 10 and the thin sheets 11 are made of plastic material and are integrally molded or cast.

The screens 8 serve to absorb pressure waves which strike them and thus to reduce wall vibration. In addition, their inwardly directed face is constituted by portions of cylinders, thereby reducing the reflection of soundwaves and thus reducing interference between reflected waves which can give rise to sound distortion.

FIGS. 1 to 3 show the tubes as being circular in section. This example is not limiting. The tubes could also have a flattened or oval section.

FIG. 1 shows an embodiment of an enclosure which also includes a block 12 situated inside the enclosure behind the loudspeakers.

In a preferred embodiment, the block 12 comprises three glued-together layers extending perpendicularly to the axes of the loudspeakers. It includes a front layer 12*a* and a back layer 12*b* which are made of a dense open-cell cellular material, for example of polyurethane foam having a density of more than 100 kg/m$^3$.

Channels 13 extending parallel to the axes x x' of the loudspeakers pass right through the two layers 12*a* and 12*b*. The channels 13 in the back layer are offset so as to be between the channels of the front layer.

The block 12 further includes an intermediate layer 12*c* which is made of a low density open-cell cellular material, e.g. a polyurethane foam having a density of not more than 30 kg/m$^3$.

The ratio between the volume of the channels and the total volume of the layers 12*a* and 12*b* lies in the range 50% to 70%.

The FIG. 1 block 12 is fixed to the top wall or to the bottom wall of the enclosure, for example.

FIGS. 2 and 3 show another embodiment of an enclosure which includes two blocks $14_1$ and $14_2$ which are situated respectively behind the base frequency loudspeaker 2 and behind the mid-frequency loudspeaker 3, and which are fixed to the speakers.

In this embodiment, there is no insulating block behind the high-frequency loudspeaker since such a block is not effective at high frequencies. The blocks $14_1$ and $14_2$ are analogous in structure to the block 12.

The purpose of the blocks 12 or $14_1$ and $14_2$ is to prevent waves reflected by the rear wall or by the side walls from coming forwards and interfering to form systems of standing waves.

FIG. 4 is a partially cut-away horizontal section through another embodiment of a block 15 made of a cellular material having open cells and which is in the form of a single part including both channels 16 running right through the block parallel to the axes x x' of the loudspeakers, and horizontal channels 17 which are perpendicular to the preceding channels and which run across the enclosure in planes lying between the planes containing the channels 16.

Not only does the invention provide enclosures fitted with acoustic screens 8 in accordance with the invention, and preferably additionally fitted with blocks of cellular material 12, $14_1$, $14_2$, or 15, but it also provides prefabricated acoustic screens and cellular blocks suitable for being delivered separately in order to enable loudspeaker enclosures in accordance with the invention to be constructed.

I claim:

1. A loudspeaker enclosure comprising:
top, bottom, front, rear and side wall members connected together to define said enclosure and an internal cavity therein, said wall members having internal and external surfaces;
at least one loudspeaker placed inside said internal cavity; and
an acoustic screen, lining the internal surface of at least one of the wall members in the internal cavity, having contiguous parallel tubes which are filled with solid dense particles that have been highly compacted into said tubes.

2. A loudspeaker enclosure according to claim 1, wherein said particles are taken for the group consisting of sand, graphite, and silica.

3. An enclosure according to claim 1, wherein the parallel tubes are interconnected by deformable and flexible connecting elements.

4. An enclosure according to claim 3, wherein said tubes and said connecting elements are made of a plastics material.

5. An enclosure according to claim 1, wherein said tubes are disposed horizontally.

6. An enclosure according to claim 1 further comprising at least one insulating block inside said internal cavity, said block being constituted by a cellular material having channels passing therethrough parallel to an axis of symmetry of the loudspeaker.

7. An enclosure according to claim 6, wherein said block comprises three glued-together vertical layers extending perpendicularly to said axis, said layers comprising a front layer and a back layer which are constituted by a high density open cell material having channels extending parallel to said axis, and an intermediate layer which is constituted by a very low density open cell cellular material.

8. An enclosure according to claim 7, wherein the channels of said front layer are offset to be between the channels of the back layer.

9. An enclosure according to claim 6, wherein said insulating block is made in a single piece and further comprises horizontal channels interposed between said channels extending parallel to said axis.

10. A loudspeaker enclosure according to claim 3, wherein said flexible connecting members are foldable so that the tubes can be brought close together.

11. A loudspeaker enclosure comprising:
top, bottom, front, rear and side wall members connected together to define said enclosure and an internal cavity therein, said wall members having internal and external surfaces;

at least one loudspeaker placed inside said internal cavity, said loudspeaker having an axis of symmetry and a front and a back surface; and an acoustic insulating block fixed to said back surface, said block made of a dense open cell material and provided with channels that extend through said block parallel to said axis.

12. A loudspeaker enclosure according to claim 11, wherein said cellular material is a polyurethene foam having a density of more than 100 kg/$m^3$.

* * * * *